United States Patent
Browning et al.

(10) Patent No.: US 6,358,331 B1
(45) Date of Patent: Mar. 19, 2002

(54) METHOD FOR IMPROVING QUALITY OF TRINIOBIUM TIN SUPERCONDUCTOR IN MANUFACTURING ENVIRONMENT BY CONTROLLING IRON CONTENT IN MOLTEN TIN BATH

(75) Inventors: Paul Frederick Browning, Rotterdam; Neil Anthony Johnson, Schenectady; Thomas Robert Raber, East Berne; Melissa Lea Murray, Mechanicville; Mark Gilbert Benz, Burnt Hills, all of NY (US)

(73) Assignee: General Electric Company, Schenectady, NY (US)

(*) Notice: Subject to any disclaimer, the term of this patent is extended or adjusted under 35 U.S.C. 154(b) by 1232 days.

(21) Appl. No.: 08/667,211

(22) Filed: Jun. 20, 1996

Related U.S. Application Data

(63) Continuation-in-part of application No. 08/416,118, filed on Apr. 3, 1995, now abandoned.

(51) Int. Cl.$^7$ .............................................. H01B 12/00
(52) U.S. Cl. ............................ 148/98; 148/281; 427/62
(58) Field of Search ........................ 148/96, 98, 276, 148/281; 427/62

(56) References Cited

U.S. PATENT DOCUMENTS 3,661,639 A * 5/1972 Caslaw ..................... 148/98
4,323,402 A    4/1982 Tachikawa et al. .......... 148/98

FOREIGN PATENT DOCUMENTS

GB    2257437    * 1/1993 ................... 427/62

OTHER PUBLICATIONS

Rumaner, L.E., "The Effect of Oxygen and Zirconium on the Growth and Superconducting Properties of $Nb_3Sn$", Technical Report No. 91 CRD124, Jun. 1991.*

"The Superconducting Performance of Diffusion–Processed Nb3Sn(CbeSn) Doped with $ZrO2$ Particles", M.G. Benz, Transactions of the Metallurgical Soc. of AIME, vol. 242, Jun. 1968—pp. 1067–1070.

"Enhancement of the Critical Current Density in Niobium–Tin" by J.S. Caslaw—Cryogenics, Feb. 1971—pp. 67–69.

* cited by examiner

*Primary Examiner*—George Wyszomierski
(74) *Attorney, Agent, or Firm*—Noreen C. Johnson; Christian G. Cabou

(57) ABSTRACT

A tin alloy bath with controlled iron content is used for coating a niobium-base substrate with tin in a manufacturing process for triniobium tin superconductor. One hundred twenty-five parts per million by weight or less of iron is used in tin alloy baths to increase the reaction kinetics of the formation of the superconductor material.

11 Claims, 4 Drawing Sheets

METHOD FOR IMPROVING QUALITY OF TRINIOBIUM TIN SUPERCONDUCTOR IN MANUFACTURING ENVIRONMENT BY CONTROLLING IRON CONTENT IN MOLTEN TIN BATH

This application is a continuation-in-part of application Ser. No. 08/416,118, filed Apr. 3, 1995, now abandoned.

FIELD OF THE INVENTION

This invention relates to a method of improving the quality and properties of triniobium tin superconductor during manufacturing operations by controlling the iron content in molten tin or tin alloy dip process. More specifically, this invention relates to identifying a critical amount of iron in a molten tin dip where the iron may influence the subsequent superconducting properties of triniobium tin superconductor.

BACKGROUND OF THE INVENTION

The intermetallic compound triniobium tin, $Nb_3Sn$, is a type-II metallic superconductor of interest because it has high values of superconducting critical current density in high magnetic fields. In order to achieve high critical current density, the process chosen to form the triniobium tin super-conductor is important. One process currently used is a liquid-solid phase diffusion method. This occurs by diffusion between a solid niobium phase and a liquid tin phase.

In manufacturing environments a technique developed for forming triniobium tin by liquid-solid diffusion is to react liquid tin with solid niobium. An integral step in this method is coating a niobium-based alloy foil with a tin or tin-copper alloy by hot dipping.

Prior to tin dipping, a niobium-based foil is cleaned by mechanical means or chemicals, such as acids. After the foil is cleaned, oxygen is added to the foil by anodizing it with a decomposition anneal or by annealing in an oxygen-rich atmosphere. The decomposition anneal or oxygen-rich anneal is then followed by a hot tin dipping process.

Tin hot dipping proceeds by drawing niobium foil through a molten tin bath. The tin bath is positioned in a chamber containing an inert atmosphere, such as argon. A roller located in the bath transfers the foil through the molten tin, which is held at a temperature greater than 950° C. At this temperature, wetting of the tin to the niobium foil is promoted by either the short hot zone above the tin bath or in the tin bath itself. As the foil leaves the bath, a layer of tin coats the surface of the niobium foil. The coated foil then exits through an inert atmosphere which serves to cool and solidify the tin layer.

In a subsequent reaction anneal, the triniobium tin superconductor is formed by the reaction of tin with the niobium. To optimize production throughout and superconducting properties, it is desirable to maximize the rate at which the triniobium tin layer is formed during the reaction anneal. The reaction rate must be consistent if a uniform triniobium tin layer thickness is to be achieved.

So that a sufficient amount of tin for the reaction anneal step is provided, a minimum limit is imposed on the thickness of the tin coating provided by the tin dip. Generally, the thickness of the tin layer is about two to thirty micrometers thick. The thickness of the tin coat influences the final thickness of the triniobium tin layer. This in turn influences the reaction kinetics and critical current density during the formation of the triniobium tin superconductor.

Recently, efforts have been made to improve the critical current density and the critical current of superconducting triniobium tin by ternary and quaternary additions to the tin dip. Improvements in critical current density of triniobium tin have been found by adding gallium, indium, silver, and aluminum to the tin bath. This is the subject of U.S. Pat. No. 4,323,402 to Tachikawa. It has been found that the addition of certain metals to the tin bath may improve the quality of the triniobium tin superconductor.

However, contaminant metals from production sources present in the manufacturing environment or contaminants contained in the tin alloy grade used in manufacturing, may decrease the triniobium tin superconducting properties. This invention has identified iron, present in manufacturing operations and tin alloys, as a contaminant that causes a limiting effect on reaction kinetics and the critical current of triniobium tin, which can be detrimental. Thus, a tolerable amount of iron in the tin bath needs to be determined in manufacturing operations.

SUMMARY OF THE INVENTION

It has been discovered that iron contamination of the molten tin-dip alloy in manufacturing operations decreases the rate of formation of triniobium tin superconductor during the reaction anneal process. It has further been discovered that a tin alloy dip having a controlled concentration of iron, one hundred twenty-five parts per million (125 ppm) by weight or less, must be used to ensure the triniobium tin has a reproducible superconducting layer thickness.

In the method of this invention, it is contemplated that the tin alloy dip can comprise a tin-copper alloy dip or an essentially pure tin dip. The tin-copper alloy contains up to about twenty weight percent copper, about one hundred twenty-five parts per million (125 ppm) by weight or less of iron, and the balance substantially tin. The essentially pure tin dip contains about one hundred twenty-five parts per million (125 ppm) by weight or less of iron and about 99.999 percent by weight tin.

Accordingly, this invention comprises a method of manufacturing triniobium tin with an optimized reaction layer that utilizes a tin alloy dip in which the iron concentration is limited to no more than about one hundred twenty-five parts per million. The method of this invention to form triniobium tin superconductor comprises passing an internally oxidized niobium-base substrate through a molten tin alloy dip containing less than or equal to one hundred twenty-five parts per million by weight iron to coat the substrate with a sufficient amount of a tin alloy coating to form the triniobium tin superconductor, and then reaction annealing the substrate with the tin alloy coating at about 900–1200° C. in an inert atmosphere for a time sufficient to form the triniobium tin superconductor.

By controlling the amount of iron contamination of the tin dip, the critical current density of the triniobium tin superconductor is increased, as is the reaction kinetics of the reaction anneal process.

DESCRIPTION OF THE INVENTION

Figure 1:
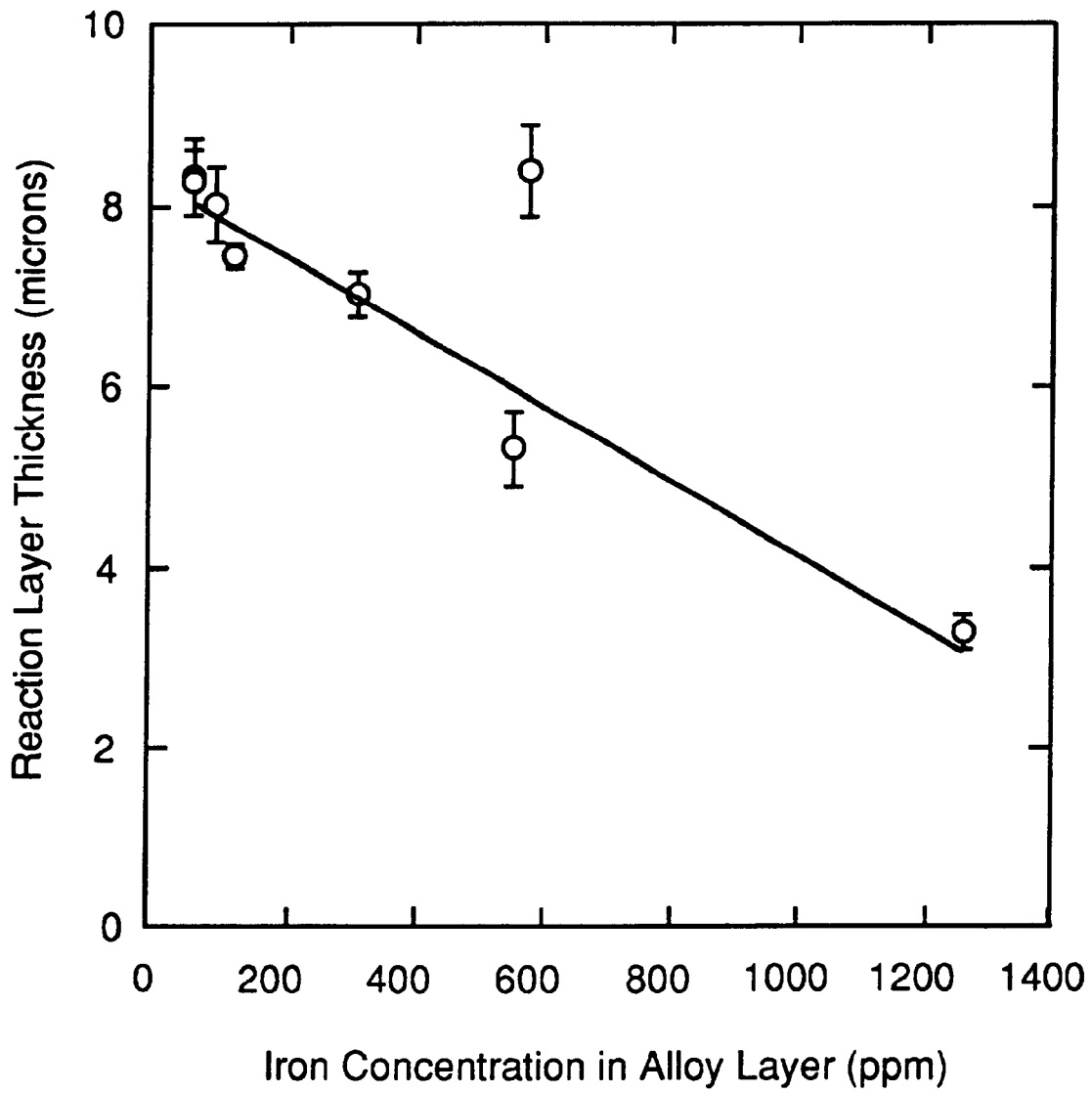
FIG. 1 is a graph showing the average triniobium tin reaction layer thickness as a function of the iron concentration in the tin-10 weight percent copper alloy layer. Samples were reaction annealed for 190 seconds at 1050° C.

Iron has been identified as a contaminant in the tin alloy dip that has a detrimental effect on the superconducting properties of triniobium tin. The presence of iron in the tin bath lowers the subsequent reaction rate of the triniobium tin in the reaction anneal process step. A variable iron concentration contributes to the formation of an uneven thickness of the superconductor, as well as a lower critical current ($I_c$) and decreased critical current density ($J_c$).

It has been discovered that the control of iron contamination in tin or tin alloy dips that are used in manufacturing operations or manufacturing environments to about 125 ppm by weight or less, improves the subsequent reaction kinetics of forming the triniobium tin superconductor, as well as improving the overall superconducting properties. The terms "manufacturing operations" or "manufacturing environment" mean processes used in a factory or suitable place to manufacture quantities of triniobium tin for commercial use. The grade of tin stock or bar used for the tin dip in manufacturing operations often contains impurities such as iron. Likewise, in manufacturing operations, the containers and parts for housing the tin dip are also a source of iron contamination. Iron is such a ubiquitous element in manufacturing processes due to its presence in steel structural members, fasteners, and in cast iron or steel crucibles, to name only a few sources, that contamination of tin alloys with iron concentrations on the order of two or more hundred wppm can and does occur. Thus, iron contamination that is found in manufacturing operations or manufacturing environments is not present in laboratory settings used for experiments. In manufacturing operations or manufacturing environments, manufacturing process conditions vary substantially from those ideal conditions employed in the laboratory.

A significant finding of this invention is that controlling of the iron contamination of the tin or tin alloy dip is extremely important if optimized and consistent superconducting properties are to be achieved in manufacturing operations of triniobium tin tape. Thus, by controlling the iron content in the molten tin or tin alloy dip in a manufacturing operation, a more manufacturable, higher quality triniobium tin product is achieved.

A feature of the present invention resides in the fact that a molten tin alloy bath consisting essentially of tin and copper with a maximum of about one hundred twenty-five parts per million by weight of iron is used to coat the surface of an annealed oxidized niobium-base substrate to subsequently form the triniobium tin superconductor having higher critical current densities. It has also been discovered that the reaction kinetics for the formation of the triniobium tin is increased by lowering the amount of iron present in the tin alloy dip.

In the method of this invention, the tin alloy bath consists essentially of about 0–20 weight percent copper, about one hundred twenty-five parts per million by weight or less iron, with the balance being substantially tin. The balance being substantially tin means that if the total alloying metals equal about twenty weight percent copper and 125 parts per million by weight iron, then the alloy balance comprises about 80 weight percent tin. The preferred amount of copper is about ten weight percent. The preferred amount of iron is about 100 parts per million by weight or less. The most preferred amount of iron is about 0–60 parts per million by weight or less.

A niobium-base substrate can be an article of foil, tape, and wire, but is not limited to these articles. Any niobium-base substrate that can be formed into triniobium tin superconductor is a suitable article for this invention. Additionally, a foil herein is defined as a niobium-base substrate having width, length, and thickness dimensions, with the thickness being greater than about 0.0005 inches.

The alloy of the niobium-base substrate is a niobium-zirconium alloy where the zirconium constitutes a minor percentage of the alloy. Generally, the zirconium content can be up to about eight weight percent, the balance being niobium. The preferred alloy is niobium-one weight percent zirconium.

It is further advantageous to deposit an oxide layer on the niobium-base substrate, such as by anodizing. The presence of the oxide layer on the niobium-base substrate is referred to in this specification as the internally oxidized niobium-base substrate. The oxide layer should be thick enough for sufficient oxygen to dissolve into the niobium-zirconium substrate. This is accomplished in an annealing step for about 10–120 seconds at a temperature above about 930° C prior to the molten tin alloy dip process. A sufficient amount of oxygen means a stoichiometric amount of oxygen to form zirconium oxide. For example, when using a niobium-one weight percent zirconium substrate, about 0.36 weight percent oxygen is desired. In atomic percent, the equivalent niobium-zirconium-oxygen substrate would be niobium-one atomic percent zirconium-two atomic percent oxygen.

Generally, the process of making a triniobium tin superconductor in accordance with this invention consists of fabricating a niobium-base substrate composed of a solid solution of zirconium in niobium into a foil, tape, wire, or suitable article in a customary manner. The niobium-zirconium substrate is then anodized by methods known to those skilled in the art so that a layer of oxide forms on the substrate. The niobium-zirconium-oxygen substrate is annealed in a decomposition anneal at a temperature greater than about 930° C. for about 10–120 seconds, in a substantially oxygen free atmosphere. A substantially oxygen free atmosphere can have up to about twenty parts per million oxygen in an inert atmosphere, such as argon, helium, and mixtures thereof.

The oxidized niobium-base substrate is then passed through a molten tin alloy bath, heated at about 500–1100° C. The bath consists of a solid solution in tin of copper and up to 125 parts per million by weight iron. The oxidized niobium-base substrate is passed through the tin alloy bath at a rate sufficient to coat the substrate with enough tin to subsequently form the triniobium tin superconductor in a reaction anneal. The thickness of the tin coating should be about 2–30 micrometers. After the tin coating is applied to the substrate, a reaction anneal is performed at about 900–1200° C. for a time sufficient to form the triniobium tin superconductor.

Applicants have further identified the invention as a method for optimizing a triniobium tin superconductor reaction layer thickness, critical current, and critical current density by controlling the iron content in a tin dip in a manufacturing operation while forming said superconductor, comprising the steps of: passing a decomposition annealed oxidized niobium-zirconium substrate through a molten tin alloy dip containing up to twenty weight percent copper, less than or equal to about one hundred twenty-five parts per million by weight iron, the balance tin, at a temperature between 500–1100° C. to coat the substrate with a sufficient amount of a tin alloy coating about 2–30 micrometers thick; and then reaction annealing the substrate with the tin alloy coating at about 900–1200° C. in an inert atmosphere for a time sufficient to form the triniobium tin superconductor having the reaction layer thickness at least about 8 microns, the critical current at 5 T (telsa), 4.2 K at least about $9 \times 10^5$ A/cm$^2$.

A further aspect of the invention includes a method for making triniobium tin superconductor in a manufacturing environment with an optimized reaction layer, critical current, and critical current density, comprising the steps of: passing the niobium-one weight percent zirconium-0.36 weight percent oxygen substrate through a molten tin alloy bath consisting essentially of ten weight percent copper, less than or equal to about 125 parts per million by weight iron, and the balance tin, at about 700–1100° C. for a time sufficient to coat the substrate with 2–30 micrometers of tin thickness; and then annealing the tin coated substrate in a reaction anneal at about 1050° C. for about 190 seconds to form the triniobium tin superconductor having the reaction layer thickness at least about 8 microns, the critical current at 5T, 4.2K at least about 140 A/mm, and the critical current density at 5T, 4.2K at least about $9 \times 10^5$ A/cm$^2$.

The preferred temperature of the molten tin alloy bath is about 700–1100° C.; the preferred tin alloy composition of the bath is about ten weight percent copper, about 100 parts per million by weight or less of iron, and the balance tin. The preferred temperature and time for the reaction anneal are 1000–1100° C. and about 50–500 seconds, respectively.

The following examples further serve to demonstrate the invention.

EXAMPLES

Incremental amounts of iron were added to the tin alloy bath (also referred to as tin alloy dip). With each incremental addition of iron, a length of oxidized niobium-base foil was coated with the contaminated tin alloy and reaction annealed. The reaction rate, grain size and superconducting properties of the resulting samples were measured. To determine if the effect of iron contamination on the reaction kinetics of the formation of the triniobium tin was related to an iron-copper interaction, two trials were performed. In the first trial, the standard tin-10 weight percent copper tin alloy bath was used. In the second trial, the tin bath composition was 99.999 weight percent tin, with no copper added.

A 1000 foot strip of niobium-1 weight percent zirconium alloy foil was acid cleaned by immersing the foil in a solution of 30% nitric acid, 10% sulfuric acid, 8% hydrofluoric acid by volume in water for 10 seconds followed by a de-ionized water rinse and dry cycle. Acid cleaning was performed to remove residual contaminants and oxides from the surface of the foil.

The foil was then anodized in an aqueous solution of 0.05 molar concentration of sodium sulfate in water. An anodized potential of 129.6 volts was used between the niobium foil (anode) and a stainless steel plate (cathode) to create an amorphous oxide film on the foil surface.

The foil was surface conditioned using a knurling process. Knurling was performed to both sides of the foil by passing it between two rolls having an embossing pattern which consisted of square-diamond shape pattern with a density of 50 teeth per inch.

The anodized foil strip was processed through a furnace having a flowing argon atmosphere and a process temperature of 1000° C. The total time at temperature in the furnace was 60 seconds. A furnace pressure of 0.97 psig was maintained to prevent oxygen from leaking into the furnace through the foil entrance and exit seals.

The tin-dip was performed using a hot dip process in which the niobium-zirconium foil was submerged and transported through a bath of molten tin alloy. Two initial tin-dip bath compositions were studied, one of which was 99.999 weight percent tin and the other of which was tin-10 weight percent copper. The tin-copper alloy was melted from 99.999% pure tin and OFHC copper. For both trials a bath temperature of 1050° C. and a foil transport velocity of 30 feet per minute were used. The foil was cooled by forced helium convection in an enclosed system, under a positive-pressure of flowing argon gas to minimize the potential for oxygen contamination of either the bath or the coated foil.

For each bath composition, foil transport was stopped at intervals of 200 feet and the foil was removed from the tin bath. Iron powder was added to the tin-dip bath to obtain specific levels of iron concentration. In the first trial, iron addition ranged from 25 ppm to 1000 ppm by weight. The iron was in powder form and 97% pure, having sieve size of 325 mesh. Samples from each section of foil corresponding to the varied tin bath iron composition were taken for chemical evaluation and further processing.

Sample lengths of 13" were cut from each of the sections of foil corresponding to the varied tin bath compositions. Each length was then statically annealed in a vertically oriented furnace with an inert argon atmosphere. Samples were reacted at the full width of one inch. For all samples a reaction anneal temperature of 1050° C. was used. In the first trial, samples were reaction annealed for 650 seconds (the longer anneal time was used to compensate for the slower reaction kinetics that result when copper is not added to the tin-dip alloy). Three additional samples from the first trial, having iron additions of 0 ppm, 250 ppm and 1000 ppm, were reacted for 50 seconds, 100 seconds and 300 seconds each to examine how the reaction rate varied with reaction time for three levels of iron composition.

The technique of inductively coupled plasma (ICP) analysis was employed for compositional analysis of tin-dipped foil samples to determine copper, iron and tin concentrations.

The average grain size was measured for samples from the first trial only. The average grain size was determined by using the linear intercept method at the center line of the reacted triniobium tin layer as determined by cross-sectional scanning electron photomicrographs of each sample. The number of grain interactions (N) is converted into the average linear intercept by applying the equation:

$$d = L/(N*X)$$

where d is the average grain diameter, L is the line length, N is the number of grain interactions measured and X is the photomicrograph magnification.

Example 1

In the first trial an initial tin-dip bath composition of tin-10 weight percent copper was used and targeted iron additions of about 25, 50, 100, 250, 500 and 1000 parts per million by weight were made to the tin alloy bath. Samples were characterized for each of these levels of iron addition. Reaction layer thickness, grain size, critical current, critical current density, and iron concentration in the tin-copper alloy dip were measured. Table 1 gives the targeted iron additions and the measured iron concentration for the tin-copper alloy dip.

TABLE 1

TIN-COPPER ALLOY DIP METAL CONCENTRATION

| Tin Alloy Composition | Targeted Fe Addition (wppm) | Measured Fe Concentration (wppm) | Copper Conc'tn (wt %) |
|---|---|---|---|
| Sn-10 wt % Cu | 0 | 59.8 | 9.9 |
| Sn-10 wt % Cu | 25 | 59.8 | 10.6 |
| Sn-10 wt % Cu | 50 | 94.8 | 10.3 |
| Sn-10 wt % Cu | 100 | 123.4 | 10.7 |
| Sn-10 wt % Cu | 250 | 316.1 | 10.2 |
| Sn-10 wt % Cu | 500 | 556.8 | 10.0 |
| Sn-10 wt % Cu | 1000 | 1248.5 | 9.7 |

In FIG. 1, reaction layer thickness of triniobium tin is plotted as a function of the measured iron concentration in the tin alloy layer of tin-dipped samples. A linear regression fit of the data is also shown. FIG. 1 shows that, for a given reaction time and temperature, the reaction layer thickness decreased linearly with increasing levels of iron contamination. Contamination of the tin-dip bath with 1248 parts per million by weight iron resulted in a 54% reduction of the reaction rate.

Figure 2:
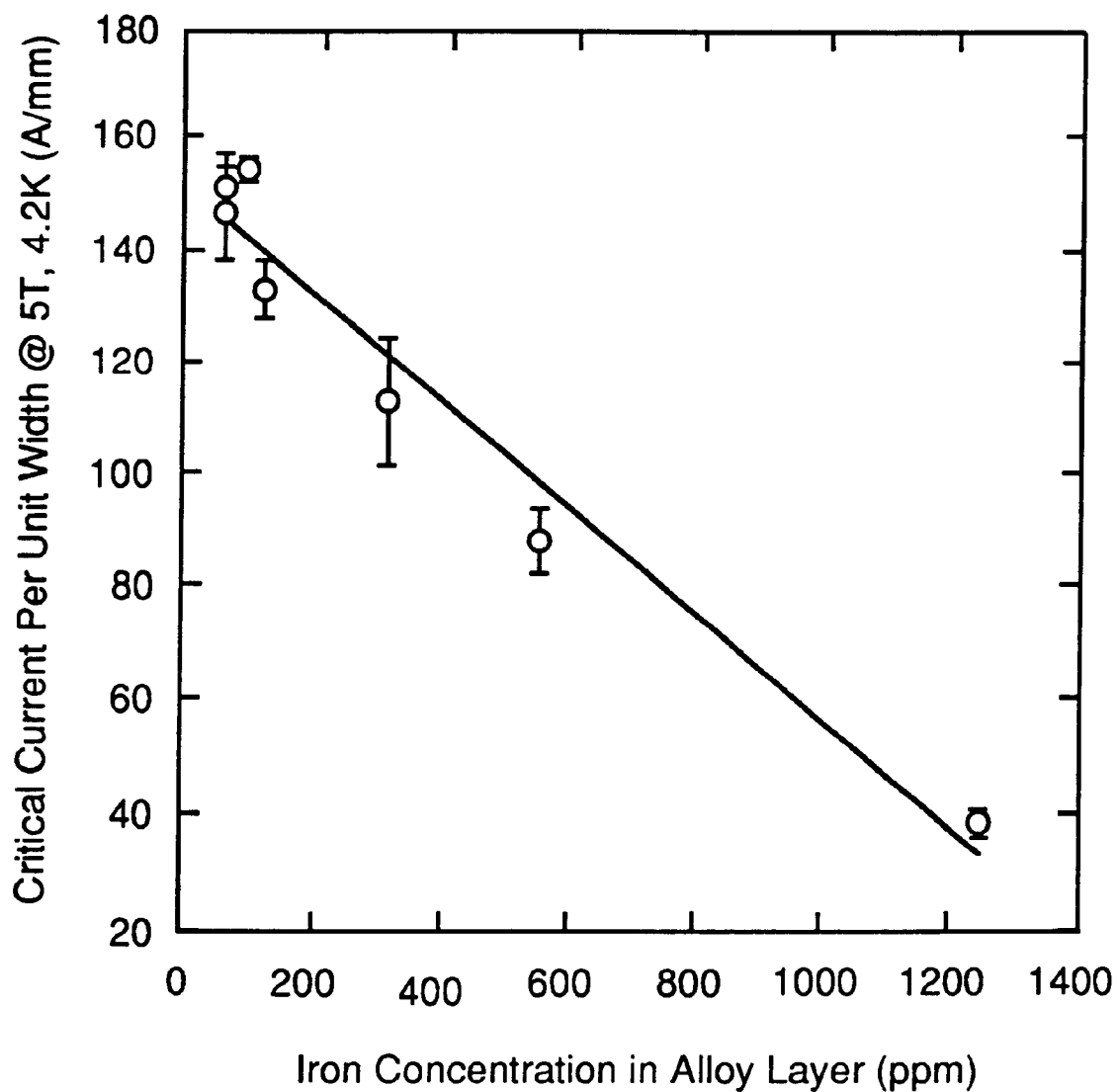
FIG. 2 is a graph depicting the superconducting critical current as a function of the iron concentration in the tin-10 weight percent copper alloy. Samples were reaction annealed for 190 seconds at 1050° C.

Critical current was measured for each sample from trial 1 only. The data are presented in FIG. 2, which shows a plot of critical current as a function of the measured iron concentration of the tin-10 wt % copper layer. A linear regression fit of the data is included. This figure demonstrates that critical current decreased linearly with increasing iron contamination of the tin-10 wt % copper alloy. Contamination of the alloy with 1248 parts per million by weight iron resulted in a 67% reduction in critical current.

Critical current density is determined by dividing the value measured for critical current ($I_c$) by the cross-sectional area of the reaction layer. The formula is as follows:

$$J_c = I_c (2wt_{rxn})$$

where Ic is the critical current, $t_{rxn}$ is the average reaction layer thickness (one side) and w is the sample width.

Figure 3:
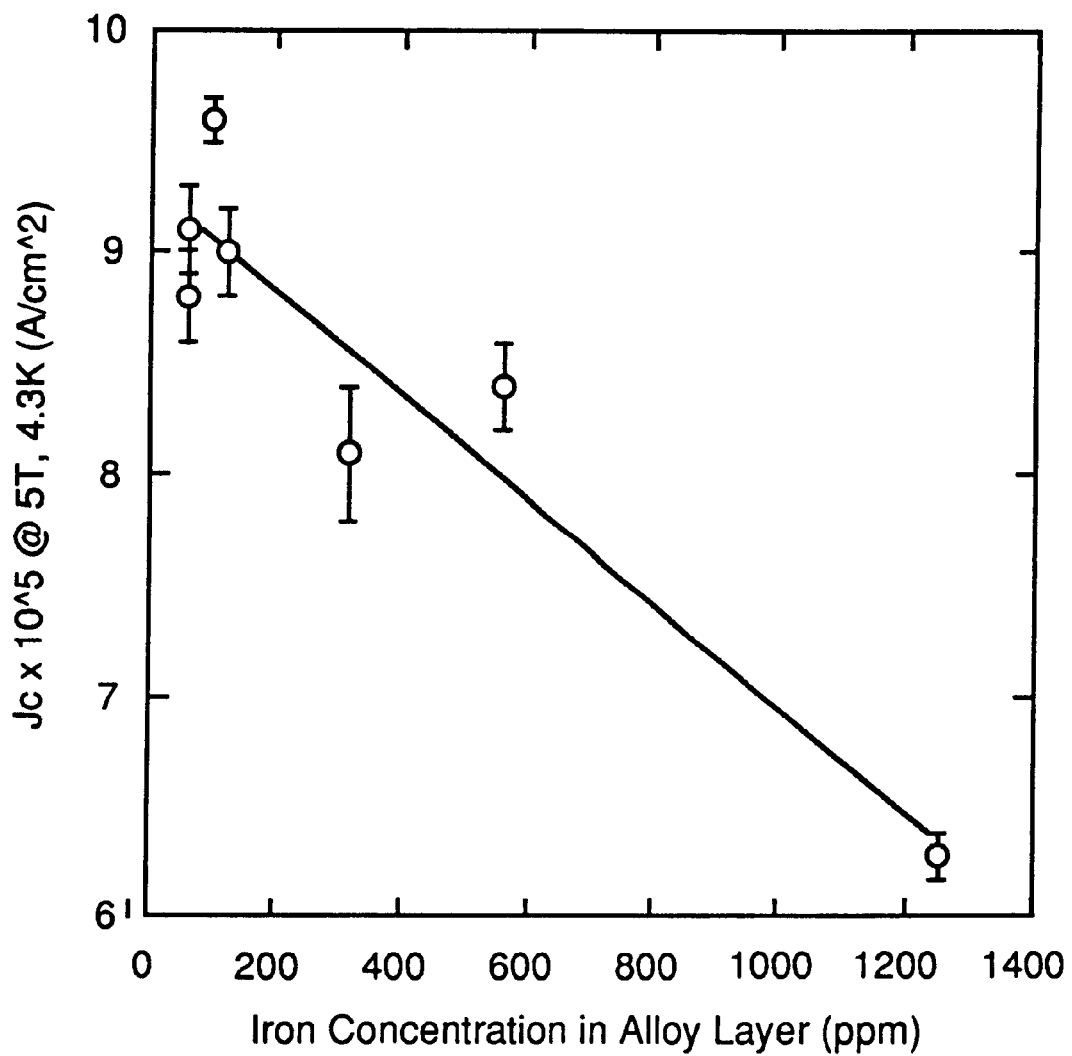
FIG. 3 is a graph showing the superconducting critical current density as a function of iron concentration in the tin-10 weight percent copper alloy layer. Samples were reaction annealed for 190 seconds at 1050° C.

FIG. 3 shows a plot of $I_c$ as a function of the measured iron concentration of the tin-10 wt % copper layer of each sample. A linear regression line fit of the data is also shown. These data indicate that $J_c$ decreases linearly with increasing iron concentration in the tin-dip alloy.

Example 2

In the second trial an initial dip bath composition of 99.999 wt % tin was used and iron additions of about 100, 250, 500, 1000, 2000 and 4000 parts per million by weight were made to the tin-dip bath. Only reaction layer thickness was measured for each level of iron addition in the second trial. Table 2 gives the targeted iron additions and the measured iron concentration for the tin dip.

TABLE 2

TIN DIP METAL CONCENTRATION

| Tin Alloy Composition | Targeted Fe Addition (wppm) | Measured Fe Concentration (wppm) |
|---|---|---|
| Sn-0 wt % Cu | 0 | 31 |
| Sn-0 wt % Cu | 100 | 120 |
| Sn-0 wt % Cu | 250 | 282 |
| Sn-0 wt % Cu | 500 | 727 |
| Sn-0 wt % Cu | 1000 | 1277 |
| Sn-0 wt % Cu | 2000 | 2536 |
| Sn-0 wt % Cu | 4000 | 4874 |

Figure 4:
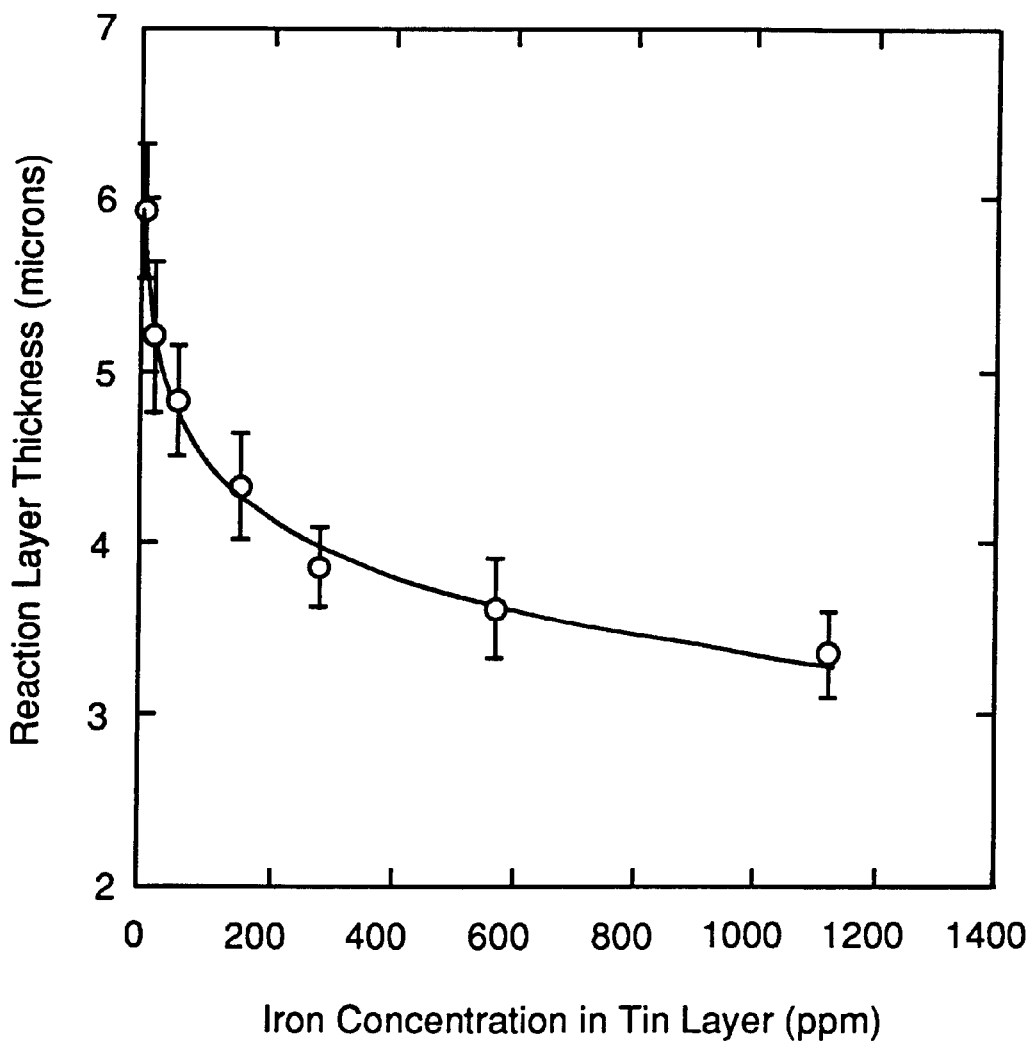
FIG. 4 is a graph showing the average triniobium tin reaction layer thickness as a function of iron concentration in an essentially pure tin layer. Samples were reaction annealed for 650 seconds at 1050° C.

Reaction layer thickness results, in which copper was not added to the initial tin-dip bath, are presented. In FIG. 4, reaction layer thickness data are plotted as a function of the measured iron concentration of the tin layer. An exponential curve fit of the data is also shown. FIG. 4 shows that reaction layer thickness decreased exponentially with increasing levels of iron addition to the 99.999 wt % tin bath.

It has been demonstrated that low levels of iron contamination in either tin-10 wt % copper alloy or pure tin baths cause a substantial decrease in the rate of triniobium tin formation during the reaction anneal. It has been shown that critical current density decreases with increasing iron concentration, but that reduction in $J_c$ is much smaller than the reduction in $I_c$ for equal concentration of iron. These findings indicate that the reduction in $I_c$ that occurred with increasing levels of iron contamination of the tin-copper alloy was primarily a result of decreased reaction kinetics (i.e. triniobium tin layer thickness).

What is claimed:

1. A method for forming a triniobium tin superconductor during a manufacturing operation, comprising the steps of:
    passing an internally oxidized niobium-base substrate through a molten tin alloy dip during a manufacturing operation while controlling iron content in the dip to less than or equal to 125 parts per million by weight iron to coat the substrate with a sufficient amount of a tin alloy coating; and then reaction annealing the substrate with the tin alloy coating at about 900–1200° C. in an inert atmosphere for a time sufficient to form the triniobium tin superconductor.

2. A method according to claim 1 where the oxidized niobium-base substrate is niobium-one atomic percent zirconium-two atomic percent oxygen.

3. A method according to claim 2 where the oxidized niobium-base substrate is a foil with a thickness greater than about 0.0005 inches thick.

4. A method according to claim 1 where the tin alloy dip contains about twenty weight percent copper and about eighty weight percent tin.

5. A method according to claim 1 where the tin alloy dip contains about 99.999 weight percent tin.

6. A method according to claim 1 where the molten tin alloy dip is a temperature between about 700–1100° C.

7. A method according to claim 1 where the tin alloy coating is about 2–30 micrometers thick.

8. A method according to claim 1 where the reaction annealing is for the time between about 50–500 seconds.

9. A method for manufacturing triniobium tin superconductor, comprising the steps of:
    passing a niobium-one weight percent zirconium-0.36 weight percent oxygen substrate through a molten tin alloy bath during a manufacturing operation, said bath consisting essentially of ten weight percent copper, up to one hundred twenty-five parts per million by weight iron, and the balance tin, at about 700–1100° C. for a time sufficient to coat the substrate with 2–30 micrometers of tin thickness; and then annealing the tin coated substrate in a reaction anneal at about 1050° C. for about 190 seconds to form the triniobium tin superconductor.

10. A method for optimizing a triniobium tin superconductor reaction layer thickness, critical current, and critical current density by controlling the iron content in a tin dip in a manufacturing operation while forming said superconductor, comprising the steps of: passing a decomposition annealed oxidized niobium-zirconium substrate through a molten tin alloy dip containing up to twenty weight percent copper, less than or equal to about one hundred twenty-five parts per million by weight iron, the balance tin, at a temperature between 500–1100° C. to coat the substrate with a sufficient amount of a tin alloy coating about 2–30 micrometers thick; and then reaction annealing the substrate with the tin alloy coating at about 900–1200° C. in an inert atmosphere for a time sufficient to form the triniobium tin superconductor having a reaction layer thickness of at least about 7 microns, a critical current density at 5 T (telsa), 4.2 K at least about $8.5 \times 10^5$ A/cm$^2$.

11. A method for making triniobium tin superconductor in a manufacturing environment with an optimized reaction layer, critical current, and critical current density, comprising the steps of: passing a niobium-one weight percent zirconium-0.36 weight percent oxygen substrate through a molten tin alloy bath consisting essentially of ten weight percent copper, less than or equal to about 125 parts per million by weight iron, and the balance tin, at about 700–1100° C. for a time sufficient to coat the substrate with 2–30 micrometers of tin thickness; and then annealing the tin coated substrate in a reaction anneal at about 1050° C. for about 190 seconds to form the triniobium tin superconductor having the reaction layer thickness at least about 7 microns, the critical current at 5T, 4.2K at least about 140 A/mm, and the critical current density at 5T, 4.2K at least about $8.5 \times 10^5$ A/cm$^2$.

* * * * *